United States Patent
Brizard et al.

(10) Patent No.: US 9,285,676 B2
(45) Date of Patent: Mar. 15, 2016

(54) SELF-ASSEMBLABLE POLYMER AND METHOD FOR USE IN LITHOGRAPHY

(75) Inventors: Aurelie Marie Andree Brizard, Eindhoven (NL); Wilhelmus Sebastianus Marcus Maria Ketelaars, Eindhoven (NL); Sander Frederik Wuister, Eindhoven (NL); Roelof Koole, Eindhoven (NL); Emiel Peeters, Eindhoven (NL); Christianus Martinus Van Heesch, Eindhoven (NL); Henri Marie Joseph Boots, Best (NL); Thanh Trung Nguyen, Eindhoven (NL)

(73) Assignee: ASML NETHERLANDS B.V., Veldhoven (NL)

(*) Notice: Subject to any disclaimer, the term of this patent is extended or adjusted under 35 U.S.C. 154(b) by 77 days.

(21) Appl. No.: 14/124,213

(22) PCT Filed: Jun. 7, 2012

(86) PCT No.: PCT/EP2012/060783
§ 371 (c)(1),
(2), (4) Date: Dec. 5, 2013

(87) PCT Pub. No.: WO2012/175342
PCT Pub. Date: Dec. 27, 2012

(65) Prior Publication Data
US 2014/0299575 A1    Oct. 9, 2014

Related U.S. Application Data

(60) Provisional application No. 61/593,668, filed on Feb. 1, 2012, provisional application No. 61/538,030, filed on Sep. 22, 2011, provisional application No. 61/500,329, filed on Jun. 23, 2011.

(51) Int. Cl.
*G03F 7/11* (2006.01)
*G03F 7/00* (2006.01)
(Continued)

(52) U.S. Cl.
CPC .............. *G03F 7/0002* (2013.01); *B82Y 10/00* (2013.01); *B82Y 40/00* (2013.01); *C08F 299/02* (2013.01); *C08F 299/04* (2013.01); *H01L 51/0043* (2013.01)

(58) Field of Classification Search
CPC ......... B82Y 40/00; G03F 7/002; G03F 7/004; G03F 7/11; H01L 51/0043
USPC ....................... 430/322, 270.1, 927
See application file for complete search history.

(56) References Cited

U.S. PATENT DOCUMENTS

| 8,574,815 B2 * | 11/2013 | Coady ................. G03F 7/0002 430/270.1 |
| 2003/0166774 A1 | 9/2003 | Hoshi et al. |

(Continued)

FOREIGN PATENT DOCUMENTS

| WO | 2008/097736 | 8/2008 |
| WO | 2009/075720 | 6/2009 |

(Continued)

OTHER PUBLICATIONS

Karl O. Stuen et al., "Graphoepitaxial assembly of asymmetric ternary blends of block copolymers and homopolymers," Nanotechnology, vol. 21, pp. 1-7 (2010).

(Continued)

*Primary Examiner* — Amanda C Walke
(74) *Attorney, Agent, or Firm* — Pillsbury Winthrop Shaw Pittman LLP

(57) ABSTRACT

A BCP having first block of first monomer and second block of second monomer, adapted to undergo a transition from disordered state to ordered state at a temperature less than $T_{OD}$, further including a bridging moiety having a functional group to provide hydrogen bonding between bridging moieties of adjacent first and second BCP molecules when in the ordered state and at a temperature in excess of a glass transition temperature $T_g$ for the BCP. Composition including BCP comprising first block of first monomer and second block of second monomer, and a crosslinking compound having first and second terminal groups joined by a central moiety and arranged to crosslink second blocks of adjacent first and second BCP molecules by providing non-covalent bonding between the terminal groups and a functional group of the second monomer of the second blocks when the BCP is in the ordered state.

21 Claims, 7 Drawing Sheets

(51) Int. Cl.
*H01L 51/00* (2006.01)
*C08F 299/02* (2006.01)
*C08F 299/04* (2006.01)
*B82Y 10/00* (2011.01)
*B82Y 40/00* (2011.01)

(56) References Cited

U.S. PATENT DOCUMENTS

| | | | |
|---|---|---|---|
| 2006/0134556 A1 | 6/2006 | Nealey et al. | |
| 2008/0193658 A1 | 8/2008 | Millward | |
| 2009/0062470 A1 | 3/2009 | Millward et al. | |
| 2009/0196488 A1 | 8/2009 | Nealey et al. | |
| 2010/0092873 A1 | 4/2010 | Sills et al. | |
| 2010/0311613 A1* | 12/2010 | Busnaina | B82Y 10/00 506/14 |
| 2011/0097559 A1* | 4/2011 | Hawker | B81C 1/00031 428/195.1 |
| 2013/0210156 A1* | 8/2013 | Wooley | A61B 5/14539 436/63 |
| 2014/0113232 A1* | 4/2014 | Brizard | G03F 7/0002 430/285.1 |
| 2015/0126691 A1* | 5/2015 | Tang | C08F 293/005 525/530 |
| 2015/0197607 A1* | 7/2015 | Montarnal | B05D 3/107 216/49 |

FOREIGN PATENT DOCUMENTS

| | | |
|---|---|---|
| WO | 2009/151834 | 12/2009 |
| WO | 2010/075116 | 7/2010 |
| WO | 2011/128120 | 10/2011 |
| WO | 2012/071330 | 5/2012 |
| WO | 2012/084558 | 6/2012 |

OTHER PUBLICATIONS

International Search Report mailed Jan. 8, 2013 in corresponding International Patent Application No. PCT/EP2012/060783.
Miri Park et al., "Block Copolymer Lithography: Periodic Arrays of ~$10^{11}$ Holes in 1 Square Centimeter," Science, vol. 276, pp. 1401-1404 (May 30, 1997).
XiaoMin Yang et al., "Directed Block Copolymer Assembly *versus* Electron Beam Lithography for Bit-Patterned Media with Areal Density of 1 Terabit/$inch^2$ and Beyond," ACS Nano, vol. 3, No. 7, pp. 1844-1858 (2009).
Ankit Vora et al., "Blends of PS-PMMA Diblock Copolymers with a Directionally Hydrogen Bonding Polymer Additive," Macromolecules, vol. 43, No. 3, pp. 1199-1202 (2010).

* cited by examiner

A          B          C (a)      (b)      (c)      (d)

SELF-ASSEMBLABLE POLYMER AND METHOD FOR USE IN LITHOGRAPHY

CROSS-REFERENCE TO RELATED APPLICATIONS

This application is the U.S. national phase entry of PCT patent application no. PCT/EP2012/060783, which was filed on Jun. 7, 2012, which claims the benefit of priority of U.S. provisional application No. 61/500,329, which was filed on Jun. 23, 2011 and U.S. provisional application No. 61/538,030, which was filed on Sep. 22, 2011 and U.S. provisional application No. 61/593,668, which was filed on Feb. 1, 2012, each of which are incorporated herein in its entirety by reference.

FIELD

The present invention relates to a method for manufacture of a device by lithography. For example, the invention relates to a method for reduction of defects and/or reduction in line edge roughness in a resist layer, particularly a resist layer of self-assembled block copolymers.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In photolithography, the push for smaller features has resulted in the development of technologies such as immersion lithography and extreme ultraviolet (EUV) radiation lithography.

So-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both photolithography and for imprint lithography, it is desirable to provide high resolution patterning of a surface, for example of an imprint template or of other substrate and a chemical resist may be used to achieve this.

The use of self-assembly of block copolymers (BCPs) has been considered as a potential method for improving the resolution to better values than those obtainable by prior art lithography methods or as an alternative to electron beam lithography for preparation of imprint templates.

Self-assemblable block copolymers are compounds useful in nanofabrication because they may undergo an order-disorder transition on cooling below a certain temperature (order-disorder transition temperature $T_{OD}$) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1-5 nm and may be manipulated by modification of the chemical compositions of the blocks of the copolymer.

The feasibility of using thin films of block copolymers as self-assembling templates was demonstrated by Chaikin and Register, et al., Science 276, 1401 (1997). Dense arrays of dots and holes with dimensions of 20 nm were transferred from a thin film of poly(styrene-block-isoprene) to a silicon nitride substrate.

A block copolymer comprises different blocks, each comprising one or more identical monomers within a block, and arranged side-by side along the polymer chain. Each block may contain many monomers of its respective type. So, for instance, an A-B block copolymer may have a plurality of type A monomers in the (or each) A block and a plurality of type B monomers in the (or each) B block. An example of a suitable block copolymer is, for instance, a polymer having covalently linked blocks of polystyrene (PS) monomer (hydrophobic block) and polymethylmethacrylate (PMMA) monomer (hydrophilic block). Other block copolymers with blocks of differing hydrophobicity/hydrophilicity may be useful. For instance a tri-block copolymer (A-B-C) may be useful, as may an alternating or periodic block copolymer (e.g. $[-A-B-A-B-A-B-]_n$ or $[-A-B-C-A-B-C]_m$ where n and m are integers). The blocks are connected to each other by covalent links in a linear or branched fashion (e.g. star or branched configuration).

A block copolymer may form many different phases upon self-assembly, dependent upon the volume fractions of the blocks, degree of polymerization within each block type (i.e. number of monomers of each respective type within each respective block), the optional use of a solvent and surface interactions. When applied in a thin film, the geometric confinement may pose additional boundary conditions that may limit the numbers of phases. In general spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled block copolymers, and the phase type observed may depend upon the relative volume fractions of the different polymer blocks.

Suitable block copolymers for use as a self-assemblable polymer include, but are not limited to, poly(styrene-b-methylmethacrylate), poly(styrene-b-2-vinylpyridone), poly(styrene-b-butadiene), poly(styrene-b-ferrocenyldimethylsilane), poly(styrene-b-ethyleneoxide), poly(ethyleneoxide-b-isoprene). The symbol "b" signifies "block" Although these are di-block copolymer examples, it will be apparent that self-assembly may also employ a tri-block, tetrablock or other multi-block copolymer.

The self-assembled polymer phases may orient with symmetry axes parallel or perpendicular to the substrate and lamellar and cylindrical phases are interesting for lithography applications, as they may form line and spacer patterns and hole arrays, respectively, and may provide good contrast when one of the domain types is subsequently etched.

Two methods used to guide self-assembly of a polymer such as a block copolymer onto a surface are graphoepitaxy and chemical pre-patterning, also called chemical epitaxy. In the graphoepitaxy method, self-organization of a block copolymer is guided by topological pre-patterning of the substrate. A self-aligned block copolymer can form a parallel linear pattern with adjacent lines of the different polymer block domains in the trenches defined by the patterned substrate. For instance if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the patterned substrate by the block copolymer pattern subdividing the spacing of a pre-pattern on the substrate.

In the chemical pre-patterning method (referred to herein as chemical epitaxy), the self-assembly of block copolymer domains is guided by a chemical pattern (i.e. a chemical template) on the substrate. Chemical affinity between the chemical pattern and at least one of the types of copolymer blocks within the polymer chain may result in the precise placement (also referred to herein as "pinning") of one of the domain types onto a corresponding region of the chemical pattern on the substrate. For instance if the block copolymer is a di-block copolymer with A and B blocks, where A is hydrophilic and B is hydrophobic in nature, and the chemical pattern comprises a hydrophobic region on a hydrophilic surface, the B domain may preferentially assemble onto the hydrophobic region. As with the graphoepitaxy method of alignment, the resolution may be improved over the resolution of the patterned substrate by the block copolymer pattern subdividing the spacing of pre-patterned features on the substrate (so-called density multiplication). Chemical pre-patterning is not limited to a linear pre-pattern; for instance the pre-pattern may be in the form of a 2-D array of dots suitable as a pattern for use with a cylindrical phase-forming block copolymer. Graphoepitaxy and chemical pre-patterning may be used, for instance, to guide the self-organization of lamellar or cylindrical phases, where the different domain types are arranged side-by-side on a surface of a substrate.

SUMMARY

In a process to implement the use of block copolymer self-assembly in nanofabrication, a substrate may be modified with a neutral orientation control layer, as part of the chemical pre-pattern or graphoepitaxy template, to induce the preferred orientation of the self-assembly pattern in relation to the substrate. For some block copolymers used in self-assemblable polymer layers, there may be a preferential interaction between one of the blocks and the substrate surface that may result in orientation. For instance, for a polystyrene(PS)-b-PMMA block copolymer, the PMMA block will preferentially wet (i.e. have a high chemical affinity with) an oxide surface and this may be used to induce the self-assembled pattern to lie oriented parallel to the plane of the surface. Perpendicular orientation may be induced, for instance, by depositing a neutral orientation layer onto the surface rendering the substrate surface neutral to both blocks, in other words the neutral orientation layer has a similar chemical affinity for each block, such that both blocks wet the neutral orientation layer at the surface in a similar manner. By "perpendicular orientation" it is meant that the domains of each block will be positioned side-by-side at the substrate surface, with the interfacial regions between domains of different blocks lying substantially perpendicular to the plane of the surface.

A neutral surface is useful in chemical epitaxy and graphoepitaxy are particularly useful. It may be used on a surface between specific orientation regions of an epitaxy template. For instance in a chemical epitaxy template for aligning a di-block copolymer with A and B blocks, where A is hydrophilic and B is hydrophobic in nature, the chemical pattern may comprise hydrophobic pinning regions with a neutral orientation region between the hydrophobic regions. The B domain may preferentially assemble onto the hydrophobic pinning regions, with several alternating domains of A and B blocks aligned over the neutral region between the specific (pinning) orientation regions of the chemical pre-pattern.

For instance in a graphoepitaxy template for aligning such a di-block copolymer the pattern may comprise hydrophobic resist features with a neutral orientation region between the hydrophobic resist features. The B domain may preferentially assemble alongside the hydrophobic resist features, with several alternating domains of A and B blocks aligned over the neutral orientation region between the specific (pinning) orientation resist features of the graphoepitaxy template.

A neutral orientation layer may, for instance, be created by use of random copolymer brushes which are covalently linked to the substrate by reaction of a hydroxyl terminal group, or some other reactive end group, to oxide at the substrate surface. In other arrangements for neutral orientation layer formation, a crosslinkable random copolymer or an appropriate silane (i.e. molecules with a substituted reactive silane, also known as silyl, end group) may be used to render a surface neutral by acting as an intermediate layer between the substrate surface and the layer of self-assemblable polymer. Such a silane based neutral orientation layer will typically be present as a monolayer whereas a crosslinkable polymer is typically not present as a monolayer and may have a layer thickness of typically 40 nm. The neutral orientation layer may, for instance, be provided with one or more gaps therein to permit one of the block types of the self-assemblable layer to come into direct contact with the substrate below the neutral orientation layer. This may be useful for anchoring, pinning or aligning a domain of a particular block type of the self-assemblable polymer layer to the substrate, with the substrate surface acting as a specific orientation feature.

A thin layer of self-assemblable polymer may be deposited onto the substrate, onto a graphoepitaxy or chemical epitaxy template as set out above. A suitable method for deposition of the self-assemblable polymer is spin-coating, as this process is capable of providing a well defined, uniform, thin layer of self-assemblable polymer. A suitable layer thickness for a deposited self-assemblable polymer film is approximately 10 to 100 nm. Following deposition of the block copolymer film, the film may still be disordered or only partially ordered and one or more additional steps may be needed to promote and/or complete self-assembly.

Self-assembly of a block copolymer is a process where the assembly of many small components (the block copolymer) results in the formation of a larger more complex structure (the nanometer sized features in the self-assembled pattern, referred to as domains in this specification). Defects arise naturally from the physics controlling the self-assembly of the polymer. Self-assembly is driven by the differences in interactions (i.e. differences in mutual chemical affinity) between A/A, B/B and A/B (or B/A) block pairs of an A-B block copolymer, with the driving force for phase separation described by Flory-Huggins theory for the system under consideration. The use of chemical epitaxy or graphoepitaxy may greatly reduce defect formation.

For a polymer which undergoes self-assembly, the self-assemblable polymer will exhibit an order-disorder temperature $T_{OD}$. $T_{OD}$ may be measured by any suitable technique for assessing the ordered/disordered state of the polymer, such as differential scanning calorimetry (DSC). If layer formation takes place below this temperature, the molecules will be driven to self-assemble. Above the temperature $T_{OD}$, a disordered layer will be formed with the entropy contribution from disordered A/B domains outweighing the enthalpy contribution arising from favorable interactions between neighboring A-A and B-B block pairs in the layer. The self-assemblable polymer may also exhibit a glass transition temperature $T_g$ below which the polymer is effectively immobilized and above which the copolymer molecules may still reorient within a layer relative to neighboring copolymer molecules.

The glass transition temperature is suitably measured by differential scanning calorimetry (DSC).

Defects formed during ordering as set out above may be partly removed by annealing. A defect such as a disclination (which is a line defect in which rotational symmetry is violated, e.g. where there is a defect in the orientation of a director) may be annihilated by pairing with other another defect or disclination of opposite sign. Chain mobility of the self-assemblable polymer may be a factor for determining defect migration and annihilation and so annealing may be carried out at a temperature where chain mobility is high but the self-assembled ordered pattern is not lost. This implies temperature up to a few ° C. above or below the order/disorder temperature $T_{OD}$ for the polymer.

Ordering and defect annihilation may be combined into a single annealing process or a plurality of processes may be used in order to provide a layer of self-assembled polymer such as block copolymer, having an ordered pattern of domains of differing chemical type (of domains of different block types), for use as a resist layer for lithography.

In order to transfer a pattern, such as a device architecture or topology, from the self-assembled polymer layer into the substrate upon which the self-assembled polymer is deposited, typically a first domain type will be removed by so-called breakthrough etching to provide a pattern of a second domain type on the surface of the substrate with the substrate laid bare between the pattern features of the second domain type.

Following the breakthrough etching, the pattern may be transferred by so-called transfer etching using an etching means which is resisted by the second domain type and so forms recesses in the substrate surface where the surface has been laid bare. Other methods of transferring a pattern, known in the art, may be applicable to a pattern formed by self-assembly of a block copolymer.

Although the techniques set out above for applying a block copolymer self-assembled layer to a surface provide partial alignment of the block copolymer structure on a surface, the resulting self-assembled layer may have a high level of incorrectly aligned polymer molecules, leading to defects in the resulting self-assembled layer.

In a self-assembled structure, a defect is likely to be present, since in most cases, the thermodynamic driving force for self-assembly is provided by weak intermolecular interactions and is typically of the same order of magnitude as the entropy term. This characteristic may be one of the main limitations in the exploitation of self-assembled features for lithography. Current state-of-the-art self-assembled layers may exhibit a defect rate of 1 in $10^3$ to 1 in $10^4$, expressed as the number of non-functional features of a multi-component device derived from the self-assembled layer (see for example Yang et. al, ACS Nano, 2009, 3, 1844-1858).

This is several orders of magnitude higher than the defect level that would be required for commercial effectiveness. These defects may appear as grain boundaries (discontinuities in the pattern) and/or as dislocations.

Self-assembly of a block copolymer is a process where the assembly of many small components (the block copolymer) results in the formation of a larger more complex structure (the nanometer sized features in the self-assembly pattern, referred to as domains in this specification) and the defects arise naturally from the physics controlling the self assembly of the polymer. Self-assembly is driven by the differences in interactions (i.e. differences in mutual chemical affinity) between A/A, B/B and A/B (or B/A) block pairs of an A-B block copolymer, with the driving force for phase separation described by Flory-Huggins theory for the system under consideration.

For a block copolymer which undergoes self-assembly, the block copolymer will exhibit an order-disorder temperature $T_{OD}$. If layer formation takes place below this temperature, the molecules will be driven to self-assemble. Above the temperature $T_{OD}$, a disordered layer will be formed with the entropy contribution from disordered A/B domains outweighing the enthalpy contribution arising from favorable interactions between neighboring A-A and B-B block pairs in the layer. The block copolymer may also exhibit a glass transition temperature Tg below which the polymer is effectively immobilized and above which the copolymer molecules may still reorient within a layer relative to neighbouring copolymer molecules.

If $T_{OD}$ is less than Tg for the block copolymer, then a self-assembled layer will be unlikely to form or will be highly defected because of the inability of the molecules to align correctly when below $T_{OD}$ and below Tg. A preferred block copolymer for self assembly has $T_{OD}$ higher than Tg. However, once the molecules have assembled into a solid-like layer, even when annealed at a temperature above Tg but below $T_{OD}$, the mobility of the polymer molecules may be insufficient to provide adequate defect removal by annealing. Multiple annealing may be carried out to give improvements in defect level, but this may take considerable time. Another option is to anneal the layer just above $T_{OD}$ to provide sufficient mobility to the polymer molecules to remove defects. However, annealing at a temperature far above $T_{OD}$ or for a too long period may result in disordering of the film. Also, as temperature increases further, the decomposition temperature $T_{dec}$, at which the polymer chains slowly start to breakdown may be reached. Clearly, it is desirable to maintain the temperature always below $T_{dec}$ while annealing is effected. A typical method of annealing is by sequential temperature cycles just above and below $T_{OD}$, for instance up to a few ° C. such as 5° C. above or below $T_{OD}$. Annealing may also or alternatively be carried out at temperatures below $T_{OD}$ such as 20° C. or more below $T_{OD}$, say 50° C. or more below $T_{OD}$. A solvent may be used to assist with annealing, for instance solvent in vapor phase may be applied to a block copolymer to partially dissolve the polymer chains of the blocks to assist in annealing. The solvent may then be subsequently removed prior to further processing of the annealed layer.

The thermodynamics of polymer self-assembly is predominantly governed by the immiscibility of the different blocks as described in Flory-Huggins theory. Whether or not a polymer will exhibit self-assembly into a nanoscale pattern is characterized by the product $\chi N$, in which $\chi$ is the Flory-Huggins interaction parameter and N is the total degree of polymerization. Mean field theory calculations indicate that an order-disorder transition should occur for $\chi N=10.5$ for a symmetrical block copolymer, which implies that a minimum total degree of polymerization required to give phase segregation for a class of block copolymers is dependent upon the Flory-Huggins parameter for this block copolymer at the annealing temperature following the relationship $N=10.5/\chi$. It should be understood that the value of 10.5 is not to be taken as a threshold, but rather it indicates a region above or below which ordering or disordering may take place and this may vary depending upon the circumstances. When $\chi N$ is less than about 10.5, the block copolymer will not generally exhibit self-assembly behavior and the resulting polymer film will be in a disordered, high entropy state. For $\chi N$ greater than about 10.5, the block copolymer may show strong segregation of the block domains and the polymer may self-assemble into a regular pattern with a sharp interface between adjacent domains of differing block types.

For block copolymers with $\chi N$ greater than 10.5, self-assembled pattern formation occurs when a thin film sample is brought to a temperature sufficiently above the glass transition temperature of the copolymer to provide reasonable polymer mobility, but below $T_{OD}$ for the polymer, to allow nano-phase separation and pattern formation.

The degree of polymerization N is directly related to the minimum characteristic domain length scale, $L_0$, attainable for a specific block copolymer. Typically $L_0 = N^\delta$, where $\delta$ can vary from 0.5 to 1.0 depending on whether the polymer exhibits strong or weak segregation. $L_0$ gives an indication of the smallest feature sizes derivable for the self-assembled polymer.

The line edge roughness (LER) for a self-assembled feature for a self-assemblable polymer, such as a block copolymer, is governed by polydispersity of the block copolymer and by the interfacial width between polymer blocks at the domain boundaries between adjacent domains of differing block type. The interfacial width is typically given by the relationship $\Delta_\infty = 2a/\sqrt{6\chi}$ for a di-block copolymer. In this equation, a is a proportionality constant.

Hence, the LER is inversely proportional to the Flory-Huggins parameter $\chi$, and so it is desirable that $\chi$ is as large as possible when the self-assembled polymer is fixed in its structure (for instance when the self-assembled polymer is solidified by reducing its temperature to a temperature below the glass transition temperature $T_g$ for the polymer) so that LER is as small as possible.

Limited pattern persistence length and high defect density can limit the usefulness of a self-assemblable polymer, such as block copolymer, for use in device lithography, such as in the semiconductor industry. Both the pattern persistence length of an ordered polymer layer and its defect density may be influenced by the value of the Flory-Huggins parameter at the temperature at which the ordered polymer layer is formed or annealed (i.e. at temperatures at or around $T_{OD}$ for the polymer). Persistence length is a measure of the ability to maintain coherence of periodicity over long distances.

A high Flory-Huggins parameter at Tg for the polymer is beneficial for LER, pattern persistence length and low defect density. However to realize these beneficial effects, the polymer chains should have the kinetic freedom and mobility to self-order and annihilate defects. To achieve this, the ordered layer should be annealed at a temperature close to $T_{OD}$. In the art, a block copolymer used for self assembly which has a high value of Flory-Huggins parameter at $T_g$ also has a very high order/disorder temperature because of the weak temperature dependence of Flory-Huggins parameter for a conventional self-assemblable polymer.

A high value for the Flory-Huggins parameter $\chi$ at the annealing temperature strongly inhibits inter-diffusion of polymer blocks of differing types, and so hinders the process leading to defect annihilation and pairing, but a high value of $\chi$ is desirable to give low line edge roughness.

Expressed more simply, using the example of an A-B block copolymer as the self-assemblable polymer, if the blocks are highly chemically incompatible, the LER will be good (small in value) for the assembled polymer and a low defect level and good persistence length may be expected when the block copolymer layer is in thermodynamic equilibrium. However, in practice, such thermodynamic equilibrium may not be reached due to low polymer chain mobility and inhibited inter-diffusion of polymer blocks which may arise from the chemical incompatibility of the blocks. As result, the defect level may be significantly higher, and persistence length may be poorer, than their theoretically attainable values at equilibrium. If the blocks are relatively chemically compatible, but just sufficiently incompatible for self-assembly to occur at low $T_{OD}$, then LER may be unacceptably large and persistence length may be poor and the defect level high.

For a polymer having a particular N value, the value of the Flory-Huggins parameter at or around $T_{OD}$ will determine the kinetics of ordering and the time taken to reach thermodynamic equilibrium, whereas the value of the Flory-Huggins parameter at $T_g$, when in equilibrium, will determine the defect level, persistence length and LER behavior. It is to be assumed that the LER will be frozen in place in the ordered layer once the polymer temperature falls below $T_g$.

Typically, for a self-assemblable polymer, the Flory-Huggins parameter is not highly dependent upon temperature. For example, a commonly used block copolymer poly(styrene-block-methylmethacrylate) (PS-block-PMMA) shows only very limited temperature dependence: $\chi = 0.028 + 3.9/T$. The values at 20° C. (273K) and at a typical anneal temperature of 180° C. differ only by about 10%.

Hence, there is provided, for example, a method, compound and composition which tackle some of the problems in the art regarding high defect level and/or low persistence length for a self-assembled polymer layer, in combination with providing an improvement in line edge roughness in a patterned layer formed from a self-assembled polymer. For instance there is provided, for example, a method and compound which allow for improvement in defect level and/or in persistence length and/or which provide reduction in defect level and/or enhancement of persistence length in a shorter time, and/or which allow for formation of a self assembled polymer layer having a low defect level and/or a high persistence length, while also providing substantially no increase in line edge roughness or even while providing reduction in line edge roughness. There is provided, for example, a method and compound which improve (reduce) line edge roughness without any substantial increase in defect level or reduction in persistence length, or to achieve good LER in combination with a low defect level.

There is provided, for example, a method, compound and composition useful for providing a self-assembled layer of block copolymer, suitable for use in device lithography, which provides a reduced defect level and/or improved persistence length without substantial reduction in line edge roughness. There is provided, for example, a method, compound and composition which provide reduction in line edge roughness without substantial increase in defect level and/or without substantial reduction of persistence length in a self-assembled layer. There is provided, for example, a method, compound and composition which provides a self-assemblable polymer which is more readily annealed to remove defects and to improve persistence length of a patterned structure while also providing low line edge roughness. There is provided, for example, a self-assemblable polymer with a low value for its order/disorder transition temperature $T_{OD}$ which also exhibits low line edge roughness when self-assembled in an ordered pattern.

By chemical affinity, in this specification, is meant the tendency of two differing chemical species to associate together. For instance chemical species which are hydrophilic in nature have a high chemical affinity for water whereas hydrophobic compounds have a low chemical affinity for water but a high chemical affinity for an alkane. Chemical species which are polar in nature have a high chemical affinity for other polar compounds and for water whereas apolar, non-polar or hydrophobic compounds have a low chemical affinity for water and polar species but may exhibit high chemical affinity for other non-polar species such as an alkane or the like. The chemical affinity is related to the free energy associated with an interface between two chemical species: if the interfacial free energy is high, then the two species have a low chemical affinity for each other whereas if the interfacial free energy is low, then the two species have a high chemical affinity for each other.

By "chemical species" in this specification is meant either a chemical compound such as a molecule, oligomer or polymer, or, in the case of an amphiphilic molecule (i.e. a molecule having at least two interconnected moieties having differing chemical affinities), the term "chemical species" may refer to the different moieties of such molecules. For instance, in the case of a di-block copolymer, the two different polymer blocks making up the block copolymer molecule are considered as two different chemical species having differing chemical affinities.

Throughout this specification, the term "comprising" or "comprises" means including the component(s) specified but not to the exclusion of the presence of others. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 3% by weight, more typically less than 1% by weight of non-specified components.

Whenever appropriate, the use of the term "comprises" or "comprising" may also be taken to include the meaning "consists essentially of" or "consisting essentially of", or may include the meaning "consists of" or "consisting of".

In this specification, when reference is made to the thickness of a feature, the thickness is suitably measured by an appropriate means along an axis normal to the substrate surface and passing through the centroid of the feature. Thickness may suitably be measured by a technique such as interferometry or assessed through knowledge of an etch rate.

Wherever mention is made of a "layer" in this specification, the layer referred to is to be taken to be layer of substantially uniform thickness, where present.

A first aspect of the invention provides a block copolymer comprising a first block of first monomer and a second block of second monomer, and adapted to undergo a transition from a disordered state to an ordered state at a temperature less than $T_{OD}$, the polymer further comprising a bridging moiety comprising a functional group arranged to provide hydrogen bonding between bridging moieties of adjacent first and second block copolymer molecules when in the ordered state and at a temperature in excess of a glass transition temperature $T_g$ for the block copolymer.

A second aspect of the invention provides a method for providing an ordered layer of a block copolymer on a substrate, the block copolymer having a glass transition temperature $T_g$ and comprising a first block of first monomer, a second block of second monomer and a bridging moiety, wherein the block copolymer is adapted to self-assemble at a temperature less than $T_{OD}$, wherein the bridging moiety of adjacent molecules of the block copolymer is arranged to be mutually bondable by hydrogen bonding at a temperature less than or equal to a transition temperature $T_H$, and wherein $T_{OD}$ is greater than $T_H$ and $T_H$ is greater than $T_g$, the method comprising:

providing a layer of the block copolymer on the substrate,
maintaining the layer at a first temperature $T_1$ above $T_g$, wherein the first temperature $T_1$ is less than or equal to $T_{OD}$ and greater than $T_H$, so that the block copolymer assembles to provide an ordered layer,
cooling the ordered layer to a second temperature $T_2$ wherein $T_2$ is less than or equal to $T_H$ and greater than $T_g$ and maintaining the ordered layer at temperature $T_2$ so that hydrogen bonding between bridging moiety of adjacent molecules is effected, and
cooling the block copolymer to a temperature below its glass transition temperature $T_g$.

The second aspect may be carried out by providing an ordered layer of a block copolymer on a substrate, the block copolymer having a glass transition temperature $T_g$ and comprising a first block of first monomer, a second block of second monomer and a bridging moiety, wherein the block copolymer is adapted to self-assemble at a temperature less than $T_{OD}$,
wherein the bridging moiety of adjacent molecules of the block copolymer is arranged to be mutually bondable by hydrogen bonding at a temperature less than or equal to a transition temperature $T_H$, wherein $T_H$ is greater than $T_g$ and greater than $T_{OD}$, the method comprising:
providing a layer of the block copolymer on the substrate,
maintaining the layer at a first temperature $T_1$ above $T_g$,
wherein the first temperature $T_1$ is greater than $T_{OD}$ and less than or equal to $T_H$, so that hydrogen bonding between the bridging moiety of adjacent molecules is effected and the block copolymer pre-assembles through hydrogen bonding of the bridging moiety,
cooling the ordered layer to a second temperature $T_2$ wherein $T_2$ is less than $T_{OD}$ or $T_H$ and greater than $T_g$ and maintaining the ordered layer at temperature $T_2$ so that the block-copolymer self-assembles, and
cooling the block copolymer to a temperature below its glass transition temperature Tg.

A third aspect of the invention provides a lithography method for patterning a surface of a substrate by resist etching, wherein the method comprises providing an ordered layer of block copolymer at the surface by a method described herein, wherein the ordered block copolymer layer acts as a resist layer.

A fourth aspect of the invention provides a composition comprising:

a block copolymer comprising a first block of first monomer and a second block of second monomer, the copolymer adapted to undergo a transition from a disordered state to an ordered state at a temperature less than $T_{OD}$, and a crosslinking compound having first and second terminal groups joined by a central moiety and arranged to crosslink second blocks of adjacent first and second block copolymer molecules by providing non-covalent bonding between the terminal groups and a functional group of the second monomer of the second blocks when the block copolymer is in the ordered state and at a temperature in excess of a glass transition temperature $T_g$ for the block copolymer.

A fifth aspect of the invention provides a lithography method for patterning a surface of a substrate by resist etching, wherein the method comprises providing an ordered layer of block copolymer at the surface from a composition according to the fourth aspect of the invention, wherein the ordered block copolymer layer is used as a resist.

The following features are applicable to all the various aspects of the invention where appropriate. When suitable, combinations of the following features may be employed as part of the methods and compositions described herein, for instance as set out in the claims. The methods and compositions may be particularly suitable for use in device lithography. For instance the methods and compositions may be used for treatment or formation of a resist layer of self-assembled polymer for use in patterning a device substrate directly or for use in patterning an imprint template for use in imprint lithography.

The first aspect is concerned with a self-assemblable block copolymer. This may be a block copolymer as set out hereinbefore comprising at least two different block types which are self-assemblable into an ordered polymer layer having the different block types associated into first and second domain types. The block copolymer may be a di-block, tri-block or multi-block copolymer. Alternating or periodic block copolymer may also be used as the self-assemblable polymer. Although only two domain types may be mentioned in some of the following aspects and examples, an embodiment of the invention is applicable to a self assemblable block copolymer with three or more different domain types.

The self-assemblable polymer is suitably a block copolymer comprising one or more first blocks of first monomer and one or more second blocks of second monomer.

In an embodiment, the block copolymer comprises a first block of first monomer and a second block of second monomer. The block copolymer, as explained hereinbefore, is adapted to undergo a transition from a disordered state to an ordered state at a temperature less than $T_{OD}$. For the sake of clarity, it must be explained that the ordered state may also be achieved, for instance, by having the block copolymer in the presence of a solvent, with the ordering achieved by removal of the solvent, for instance by evaporation. For some block copolymers, the value of $T_{OD}$ may be greater than the decomposition temperature $T_{dec}$ for the polymer, and so ordering by loss of solvent may be desired. Similarly, annealing may be carried out in the presence of a solvent, for instance added to the block copolymer using a solvent vapor, in order to provide for increased mobility of the block copolymer to allow re-ordering without necessarily taking the block copolymer above $T_{OD}$.

In this specification, $T_{OD}$, $T_H$ and $T_g$ refer to the block copolymer as such. However, it will be understood that an embodiment of the invention may also be put into effect with the block copolymer in the presence of a solvent which may affect the block copolymer chain mobility.

The polymer further comprises a bridging moiety comprising a functional group arranged to provide hydrogen bonding between bridging moieties of adjacent first and second block copolymer molecules when in the ordered state. This hydrogen bonding occurs at a temperature in excess of a glass transition temperature $T_g$ for the self-assemblable block copolymer. No special meaning is assigned, in this specification, to the terms "first" and "second" block copolymer molecules: these are intended to describe adjacent identical molecules of the block copolymer.

The bridging moiety of the first and second adjacent molecules of the block copolymer are arranged to be mutually bondable by hydrogen bonding at a temperature at or below a transition temperature $T_H$, wherein $T_{OD}$ is greater than $T_H$ and $T_H$ is greater than $T_g$. The first and second adjacent molecules of the block copolymer are not mutually bondable by hydrogen bonding at a temperature in excess of $T_H$. In other words, the molecules are arranged so that above some transition temperature $T_H$, the entropy contribution to the total free energy of the system arising from having the bridging moieties not mutually bonded will exceed the free energy contribution arising from having the hydrogen bonding in place, and so the bonds will be dissipated. This transition temperature $T_H$ may be measured by a suitable means such as DSC. In an alternative arrangement, $T_H$ may be greater than $T_{OD}$ so that the formation of hydrogen bonds between the bridging moiety may be used to pre-organize the block copolymer molecules by linking them together at the bridging moiety, then initiating subsequent self-assembly below $T_{OD}$.

The transition temperature $T_H$ may be varied by variation of the chemical nature of the bridging moiety of and the hydrogen bonding group contained therein. Suitably, the value of this transition temperature is less than the order disorder transition temperature for the block copolymer. This helps ensure that the molecules of the block copolymer self assemble in a manner primarily driven by the chemical incompatibility of the individual first and second blocks when the layer is cooled below the order-disorder transition temperature, rather than being controlled by crystallization of the hydrogen bonding bridging moiety, provided that the ordering takes place at a temperature above the transition temperature $T_H$ and below the disorder temperature $T_{OD}$. This is thought to help ensure that the self assembled structure formed has a lowest attainable defect level achievable.

The bridging moiety may be located anywhere within the block copolymer molecular structure, for instance at a terminal end of one of the blocks, or midway along a block. Desirably, the first and second blocks are each directly covalently bonded to the bridging moiety, so that the bridging moiety also acts as a link between the first and second blocks of the block copolymer, being covalently bonded to each block to join the blocks together.

Suitably, the hydrogen bonding linking the bridging moiety of adjacent block copolymer molecules together is between a first functional group of the bridging moiety of the first adjacent molecule and a second functional group of the bridging moiety of the second adjacent molecule and between the second functional group of the bridging moiety of the first adjacent molecule and the first functional group of the bridging moiety of the second adjacent molecule. In other words, the bridging moieties may each comprise at least two mutually complementary functional groups positioned for hydrogen bonding between adjacent block copolymer molecules.

For instance, the bridging moiety comprises at least one urea group, desirably at least 2 urea groups, with the urea group providing a first >NH (secondary amine) functional group and a second =O (carbonyl) functional group so that these groups, from adjacent bridging moiety of adjacent block copolymer molecules, may form hydrogen bonds with each other.

Another suitable bridging moiety may comprise one or more amide groups, each with a first >NH (secondary amine) functional group and a second =O (carbonyl) functional group so that these groups, from adjacent bridging moiety of adjacent block copolymer molecules, may form hydrogen bonds with each other.

Another suitable bridging moiety comprises at least one 2-ureido[1H]-pyrimidin-4-one group, desirably at least two 2-ureido[1H]-pyrimidin-4-one groups.

Another suitable bridging moiety comprises at least one peptide group. The hydrogen bonds may then be formed between a secondary amine and a carbonyl group. Suitably, the peptide group may comprise from 2 to 10 amino acids. A suitable peptide group is a polyalanine.

The bridging moiety may further comprise an oligomeric stabilizing portion having a low chemical affinity with both the first monomer and with the second monomer. For instance, the oligomeric stabilizing portion may be selected from the group consisting: of an oligomer comprising one or more aromatic rings, a perfluorinated oligomer, and a silicone oligomer.

The second aspect may provide a method for providing an ordered layer of a block copolymer on a substrate. The block copolymer may suitably be the block copolymer of the first aspect. The method may comprise providing a layer of the block copolymer on the substrate, maintaining the layer at a first temperature $T_1$ above $T_g$, wherein the first temperature $T_1$ is less than or equal to $T_{OD}$ and greater than $T_H$, so that the block copolymer assembles to provide an ordered layer, cooling the ordered layer to a second temperature $T_2$ wherein $T_2$ is less than or equal to $T_H$ and greater than $T_g$ and maintaining the ordered layer at temperature $T_2$ so that hydrogen bonding between bridging moiety of adjacent molecules is effected, and cooling the block copolymer to a temperature below its glass transition temperature Tg.

Typically, the layer of block copolymer may be provided on the substrate by a suitable deposition means such as spin-coating. The block copolymer may be held at a temperature above $T_{OD}$ to help ensure that it is in a disordered state prior to effecting maintaining the layer at the first temperature $T_1$ above $T_g$. $T_1$ does not have to remain as a fixed temperature during the maintaining provided that it remains above $T_g$, less than or equal to $T_{OD}$ and greater than $T_H$. In other words, the use of the term "maintaining" does not necessarily imply that $T_1$ is invariable. This also applies to $T_2$, which should be less than or equal to $T_H$ and greater than $T_g$, but which may vary in value while being maintained within this range of temperatures.

After cooling the ordered layer to the second temperature $T_2$, the layer may be cycled in temperature between alternating first and second temperatures prior to cooling the block copolymer to a temperature below its glass transition temperature Tg.

The time during which the layer is maintained at a first temperature $T_1$ is sufficient so that the block copolymer assembles to provide an ordered layer, and may typically, for instance, be from about 1 minute to 2500 minutes. Similarly, the time during which the layer is maintained at a second temperature $T_1$ is sufficient so that the bridging moiety may bond together by hydrogen bonding to reduce defects. This may typically be, for instance, be from about 1 minute to 2500 minutes.

In another arrangement, the second aspect may comprise providing an ordered layer of a block copolymer on a substrate, the block copolymer having a glass transition temperature $T_g$ and comprising a first block of first monomer, a second block of second monomer and a bridging moiety, wherein the block copolymer is adapted to self-assemble at a temperature less than $T_{OD}$, wherein the bridging moiety of adjacent molecules of the block copolymer is arranged to be mutually bondable by hydrogen bonding at temperatures less than or equal to a transition temperature $T_H$, wherein $T_H$ is greater than $T_g$ and greater than $T_{OD}$, the method comprising:
providing a layer of the block copolymer on the substrate, maintaining the layer at a first temperature $T_1$ above $T_g$,
wherein the first temperature $T_1$ is greater than $T_{OD}$ and less than or equal to $T_H$, so that hydrogen bonding between bridging moiety of adjacent molecules is effected and the block copolymer pre-assembles through hydrogen bonding of the bridging moiety, cooling the ordered layer to a second temperature $T_2$ wherein $T_2$ is less than $T_{OD}$ or $T_H$ and greater than $T_g$ and maintaining the ordered layer at temperature $T_2$ so that the block-copolymer self-assembles, and cooling the block copolymer to a temperature below its glass transition temperature Tg.

The third aspect provides a lithography method for patterning a surface of a substrate by resist etching. The method comprises providing an ordered layer of the block copolymer as describe herein at the surface by a method described herein. The ordered block copolymer layer acts as a resist layer. For instance, the different blocks of the ordered polymer may each exhibit different etch resistivity. Alternatively, one of the blocks may be selectively removed e.g. by photo-degradation and the remaining block may serve as an etch resist.

The fourth aspect of the invention provides a composition comprising:

a block copolymer comprising a first block of first monomer and a second block of second monomer, the copolymer adapted to undergo a transition from a disordered state to an ordered state at a temperature less than $T_{OD}$, and a crosslinking compound having first and second terminal groups joined by a central moiety and arranged to crosslink second blocks of adjacent first and second block copolymer molecules by providing non-covalent bonding between the terminal groups and a functional group of the second monomer of the second blocks when the block copolymer is in the ordered state and at a temperature in excess of a glass transition temperature $T_g$ for the block copolymer.

The composition may consist essentially or consist of the block copolymer and the crosslinking compound, or in a suitable arrangement, the composition may further comprise a solvent for the block copolymer and the crosslinking compound.

Typically, the composition may comprise from 1 to 20% by weight, say from 10 to 20% by weight of the crosslinking compound, expressed as a percentage of the combined total weight of block copolymer and crosslinking compound.

The non-covalent bonding may be hydrogen bonding between the terminal groups and the functional groups of the second monomer. The non-covalent bonding may be ionic bonding between charged terminal groups and oppositely charged functional groups of the second monomer.

The crosslinking may occur at a temperature at or below a transition temperature $T_H$, wherein $T_{OD}$ is greater than $T_H$ and $T_H$ is greater than $T_g$, and wherein the crosslinking is not present or not substantially present at a temperature in excess of $T_H$.

The crosslinking compound suitably has a molecular weight of 1500 Dalton or less, 1000 or less, or 500 or less.

The fifth aspect of the invention provides a lithography method for patterning a surface of a substrate by resist etching, wherein the method comprises providing an ordered layer of block copolymer at the surface from a composition according to the fourth aspect of the invention, wherein the ordered block copolymer layer is used as a resist.

BRIEF DESCRIPTION OF THE DRAWINGS

Specific embodiments of the invention will be described with reference to the accompanying Figures, in which.

DETAILED DESCRIPTION

Figure 1A:
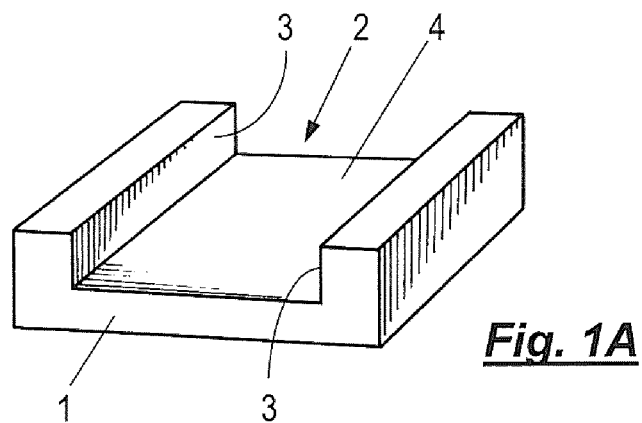
FIGS. 1A to 1C schematically depict a directed self-assembly of an A-B block copolymer onto a substrate by graphoepitaxy and formation of a relief pattern by selective etching of a domain.
Figure 1B:
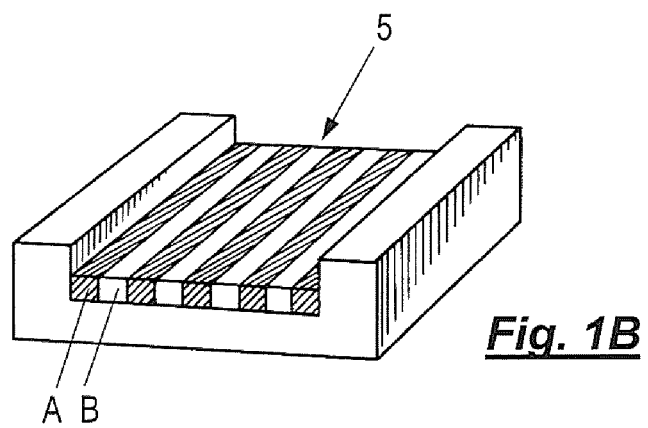
Figure 1C:
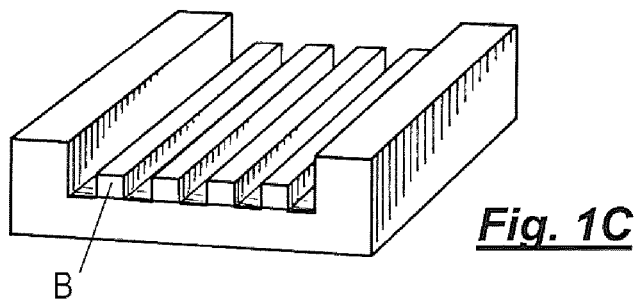

FIG. 1A shows a substrate 1 with a trench 2 formed therein bounded by side walls 3 and a bottom surface 4. In FIG. 1B, a self-assemblable A-B block copolymer with lyophilic (e.g., hydrophilic) A blocks and lyophobic (e.g., hydrophobic) B blocks has been deposited into the trench to form a layer 5 with alternating stripes of A and B domains which have deposited as a lamellar phase separated into discrete micro-separated periodic domains during deposition of the block copolymer. This is referred to as graphoepitaxy. The type A domains have nucleated adjacent to the a side wall 3, which is also lyophilic (e.g., hydrophilic). In FIG. 1C, the type A domains have been removed by selective chemical etching, leaving the type B domains to form a relief pattern in the trench where they may serve as a template for subsequent patterning of the bottom surface 4, for instance by further chemical etching. Selective removal may be achieved, for instance, by selective photo-degradation or photo-cleavage of a linking agent between blocks of the copolymer and subsequent solubilization of one of the blocks. The pitch or wavelength of the self-assembled polymer structure 5 and the width of the trench 4 are arranged so that a number of alternating stripes of domains can fit into the trench with a type A domain against each side wall.

Figure 2A:
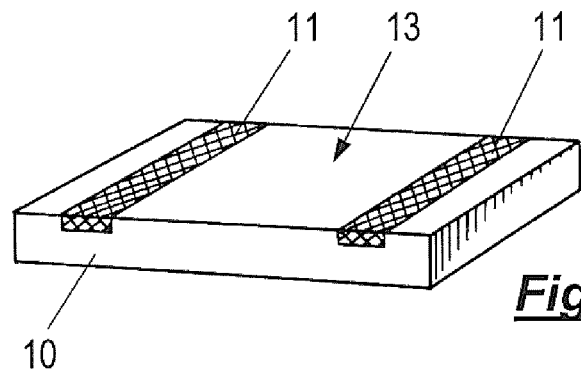
FIGS. 2A to 2C schematically depict a directed self-assembly of an A-B block copolymer onto a substrate by chemical pre-patterning and formation of a relief patterns by selective etching of a domain.
Figure 2B:
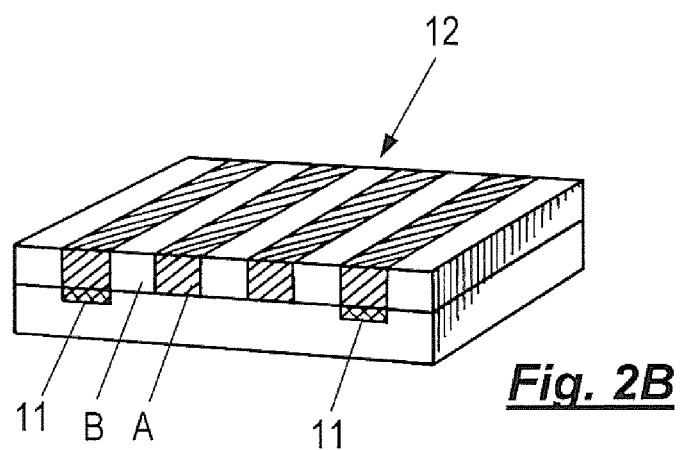
Figure 2C:
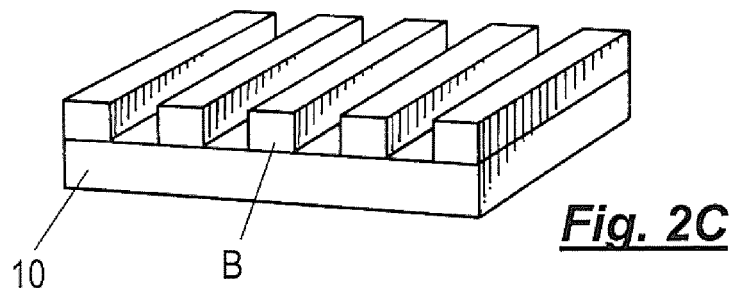

FIG. 2A shows a substrate 10 with a chemical pattern in the form of pinning stripes 11 which have been chemically formed on the surface 13 to provide regions with a higher affinity for the type A blocks of the polymer. In FIG. 2B, a self-assemblable A-B block copolymer with lyophilic (e.g., hydrophilic) A blocks and lyophobic (e.g., hydrophobic) B blocks has been deposited onto the surface 13 of substrate 10 to form a lamellar phase layer 12 with alternating stripes of A and B domains which have phase separated into discrete micro-separated periodic domains during deposition of the block copolymer. This is referred to as chemical pre-patterning. The type A domains have nucleated atop the pinning stripes 11, which are also lyophilic (e.g., hydrophilic). In FIG. 1C, the type A domains have been removed by selective chemical etching, leaving the type B domains to form a relief pattern on the surface 13 where they may serve as a template for subsequent patterning of surface 13, for instance by further chemical etching. The pitch or wavelength of the self-assembled polymer structure 12 and the spacing of the pinning stripes 11 are arranged so that a number of alternating stripes of domains can fit between the pinning stripes 11 with a type A domain atop each pinning stripe 11.

Figure 3:
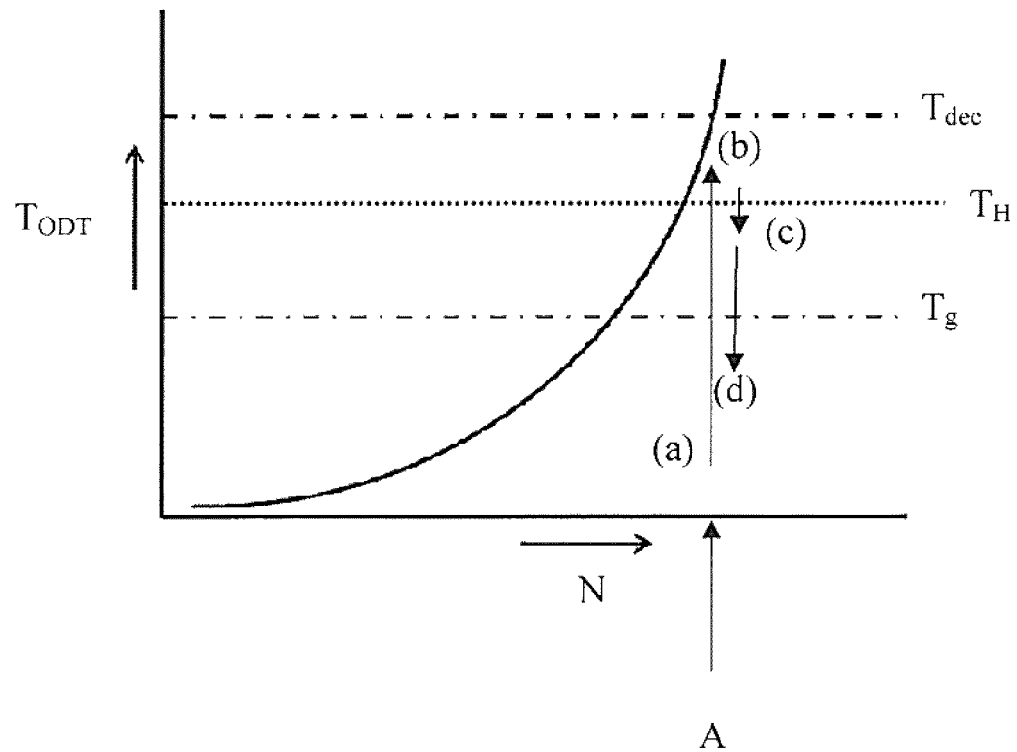
FIG. 3 schematically depicts a plot of the order-disorder temperature ($T_{OD}$) as a function of the number of monomers (N) in a block copolymer.

FIG. 3 shows a plot of the order-disorder temperature ($T_{OD}$) as a function of the number of monomers (N) in a block copolymer. The additional interactions disappear above $T_H$. At the position A shown on the diagram, letters (a) to (d) linked by arrows schematically indicate the steps of a process according to an aspect of the invention. The block copolymer initially at (a) with a low temperature in a disordered state—but with low mobility—after deposition onto a substrate by, e.g., spin-coating (<Tg) is heated to (b)—corresponding to first temperature $T_1$ a temperature close to $T_{OD}$ at which temperature the block copolymer molecules may order and self-assemble, and then subsequently cooled down to (c), second temperature $T_2$, below $T_H$ and above $T_g$ where it is held to reduce defectivity and/or improve line edge roughness through hydrogen bonding of bridging moieties, then finally cooled (d) to a temperature below Tg in order to make permanent the ordered structure.

Figure 4:
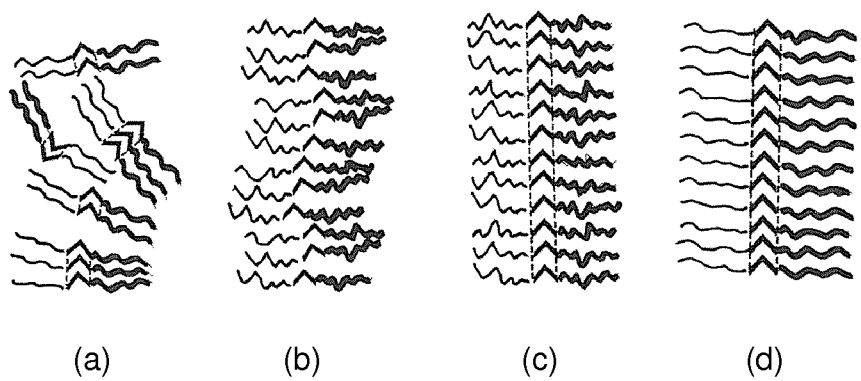
FIG. 4 schematically depicts micro-phase separation, at the molecular level, of block copolymer molecules provided with a bridging moiety (^) linking the 1st block and 2nd block of each block copolymer molecule.
Figure 5:
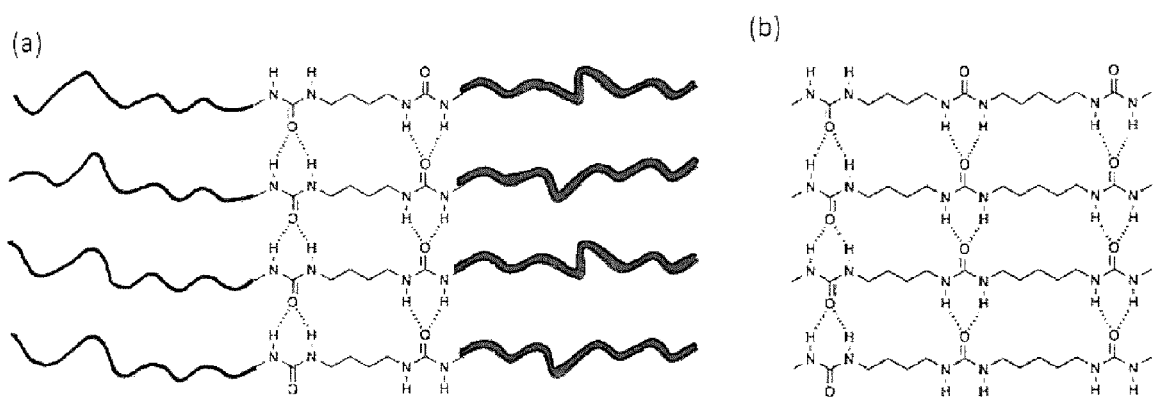
FIGS. 5 (a) and (b) schematically depict adjacent molecules of block copolymer linked by hydrogen bonding between adjacent bridging moieties, wherein the bridging moieties comprise a urea group.
Figure 6:
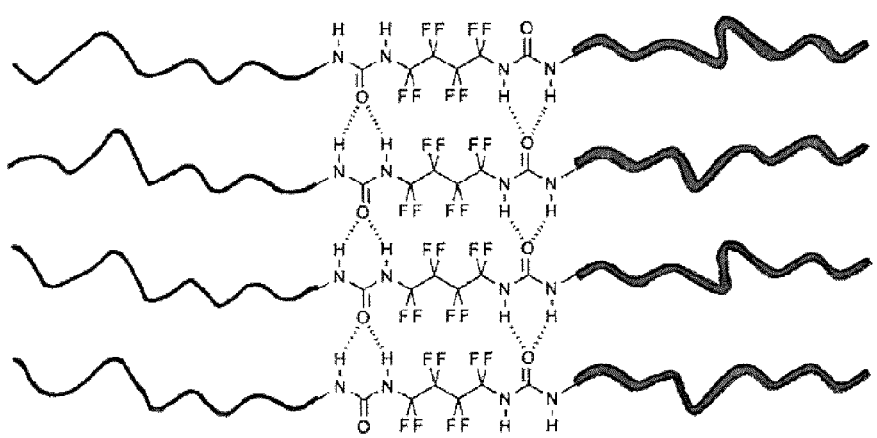
FIG. 6 schematically depicts adjacent molecules of block copolymer linked by hydrogen bonding between adjacent bridging moieties, wherein the bridging moieties comprise a urea group in addition to a perfluorinated oligomeric stabilizing portion.

In FIGS. 4, 5 and 6, the di-block copolymer used as self-assemblable polymer is a block copolymer based upon poly(styrene-b-methylmethacrylate) block copolymer, but with a bridging moiety linking the polystyrene block (shown as thick or heavy line) with the polymethylmethacrylate block (shown in thinner or lighter line). Other blocks may be used in preparing the block copolymer of an embodiment of the invention; these are simply examples of suitable blocks for self-assembly.

In FIG. 4, the different sections (a) to (d) show a schematic representation of micro-phase separation and ordering of a block copolymer brought into order following a method according to, for example, FIG. 3. The sections (a) to (d) in FIG. 4 correspond to the equivalent labelled portions in the diagram shown in FIG. 3. The bridging moiety is indicated by ^ in FIGS. 4(a) to 4(d). The first block is shown as narrow lines and the second block as thick lines.

After application through, e.g., spin-coating, the block copolymer is poorly organized and clustered in small aggregates (a). Upon temperature increase (b) to a temperature $T_1$ above $T_g$ and $T_H$, and close to $T_{OD}$, the block copolymer reorganizes to lower its free energy, by spontaneously phase separating into regular patterns (b), with first and second blocks of adjacent block copolymer molecules aligned into first and second domains. After being maintained at $T_1$ (b) for a period to allow alignment and self-assembly into domains, the layer is cooled to $T_2$ (c), a temperature below $T_H$, so that hydrogen bonding between the bridging moieties can now occur leading to improved, correct placement of the adjacent block copolymer molecules relative to each other, reducing defects and/or improving line edge roughness. After holding at temperature $T_2$ for a time sufficient to enable this to be effected, the layer is then cooled (d) to a temperature lower than $T_g$. The hydrogen bonding between adjacent bridging moieties is effected while block copolymer mobility is such that fine movement of the polymer chains is possible (i.e. above $T_g$).

The additional hydrogen bonding interactions between bridging moieties of adjacent block copolymer molecules, present at temperatures lower than $T_H$ are capable of bridging the block copolymer chains at specific positions relative to each other, allowing improved alignment of the domains resulting from the self-assembly of the block copolymer.

Without wishing to be bound by any theory, it is postulated that a decrease in defect level and an improvement (reduction) in line edge roughness is achieved by introducing additional hydrogen bonding interactions, capable of bridging the polymer chains at a specific position, allowing accurate positioning of adjacent block copolymers relative to each other as domains are self-assembled. The introduction of a bridging moiety capable of providing hydrogen bonding between adjacent block copolymer molecules allows for accurate placement of the block copolymer molecules into a pre-organized pattern driven by the minimization of total free energy. This phenomenon can alternatively be described as a locally increased Flory-Huggins parameter, as the presence of the hydrogen bonding bridging moiety will locally encourage separation between the immiscible blocks of the copolymer by providing further free energy reduction when alignment is achieved. The result is an overall decrease in defect density in the block-copolymer self-assembled structure.

Furthermore, the presence of the bridging moiety may also decrease the molecular weight of the blocks required for self-assembly to occur, and this in turn may lead to a reduction in the domain spacing of the self-assembled structure, improving resolution. An embodiment of the invention is effective irrespective of whether graphoepitaxy or chemical epitaxy is used to provide a template for alignment of the self-assembled layer on a substrate and may be used for spherical and cylindrical as well as laminar or lamellar self-assembled structures.

When a neutral orientation layer is present on a substrate, as set out hereinbefore, the neutral orientation layer may be selected to bond to the bridging moiety, or may be selected to not provide bonding with the bridging moiety. For instance, a substrate may be chemically patterned with a structure comprising a portion adapted for hydrogen bonding and a portion not so adapted, so that a chemical epitaxy pattern is provided on the substrate to act as a template for organization of the self-assembly of the block copolymer.

In FIG. 5, a first example of a bridging moiety is shown, comprising a urea group so that hydrogen bonding is provided between adjacent bridging moieties. A urea moiety can establish two hydrogen bonds between pairs of urea groups on adjacent block copolymer molecules as shown, between carbonyl and secondary amine functional groups. At least two urea groups, referred as bis-urea, may be employed, with the urea groups separated by an alkyl spacer of typically 4 to 20 carbons. Compared to the typical degree of polymerization of the block copolymer, such a short oligomeric bridging moiety should not be considered a third block. At a temperature below $T_H$, the bridging moiety may effectively "crystallize", into a fixed structure as shown, stabilized by four hydrogen bonds that will dissipate upon temperature increase above $T_H$. Typically, $T_H$ may be about 120° C. with a $T_g$ of about 80° C. and a $T_{OD}$ of about 250° C. or more; this temperature for $T_H$ would suit the thermal properties of a poly(styrene-b-methylmethacrylate) block copolymer.

Multiple urea groups may be employed, as shown in FIG. 5(b). For instance from 2 to typically 8 or 10 urea groups may be suitable, with fixed or variable spacer lengths between the urea groups. In situations where the blocks of the block copolymer may exhibit steric hindrance which inhibits hydrogen bond formation, greater numbers of urea units may be employed in the bridging moiety to reinforce the strength of their hydrogen bonding interactions, in which case segments of typically 1000 to 2000 g/mol (10-20 urea units) may be useful. Such flexibility in the design, by selection of the nature of the bridging unit, enables the temperature $T_H$ to be selected: the temperature $T_H$ increases with the number of urea groups in the bridging moiety.

FIG. 6 shows another suitable bridging moiety. For this example, the spacer between a pair of urea groups in the bridging moiety is a perfluorinated oligomer. The use of such an oligomeric stabilizing portion, which has a low chemical affinity for both of the first and second monomers of the block copolymer, further assists the driving force for the bridging moiety to crystallize by stacking adjacent to each other. A short perfluorinated oligomer is highly immiscible with a hydrocarbon moiety. Other suitable oligomeric stabilizing portions which may be used in this manner may include a silicone oligomer and/or an oligomer comprising one or more aromatic rings. A further advantage when a silicone oligomer is used as an oligomeric stabilizing portion is that such a material may be highly resistant to etching, and so when the self-assembled layer is used as a resist for device lithography, extremely narrow features may be defined by tracks of remaining silicone oligomer permitted to remain on a substrate after etching.

Figure 7:
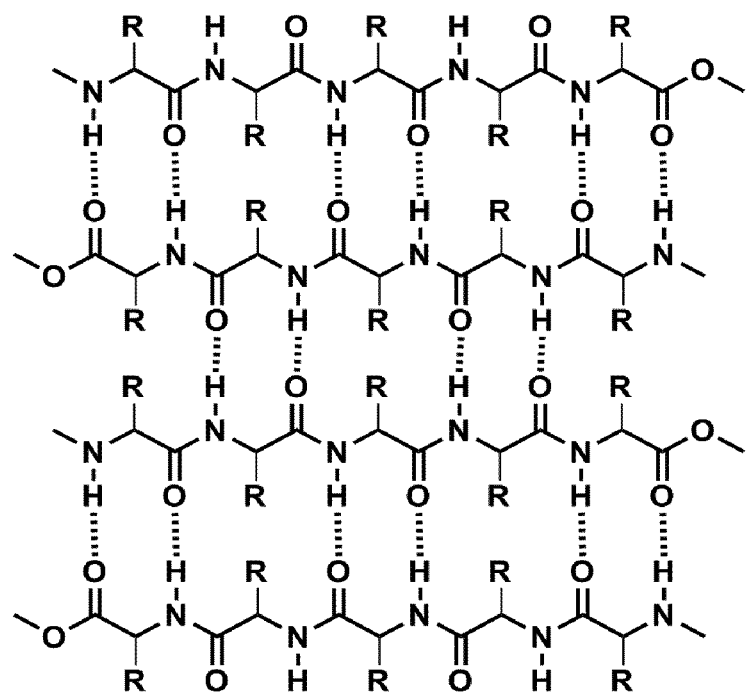
FIG. 7 schematically depicts adjacent bridging moieties of adjacent molecules of block copolymer linked by hydrogen bonding between the bridging moieties, wherein the bridging moieties comprise a polypeptide.

FIG. 7 schematically shows a situation where short peptidic sequences are used as a bridging moiety, assembling into sheets with planar networks of hydrogen bonds. The example shown is for a pentapeptide bridging moiety. A polyalanine, for instance, can form sheets with as few as five amino acids forming the bridging moiety. Such short sequences, ranging from typically tetramers to decamers, are suitable for use as the bridging moiety.

Figure 8:
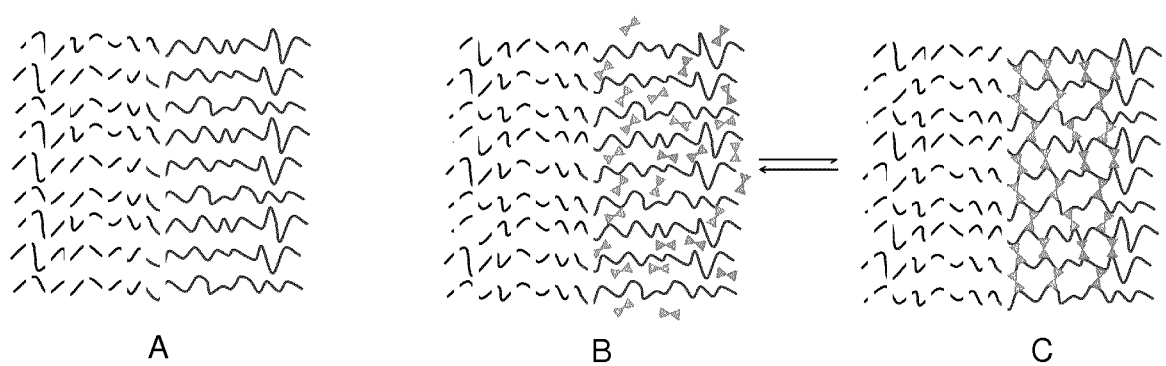
FIGS. 8A to 8C schematically depict the use of a crosslinking compound to form a composition with a block copolymer to form reversible crosslinks between second blocks of a block copolymer.

FIGS. 8A to 8C schematically depict the use of a crosslinking compound to form a composition with a block copolymer to form reversible crosslinks between the second blocks of a block copolymer. The first blocks are shown in each of FIGS. 8A, 8B and 8C as broken lines, with the second blocks indicated as solid lines. The molecules of the crosslinking compound are indicated by "hourglass" shapes in these Figures, with the ends having a terminal group adapted to provide non-covalent bonding with a functional group on second monomer of the second blocks of the block copolymer molecules.

In FIG. 8B, the temperature is sufficiently high that the crosslinking compound does not form crosslinks, whereas in FIG. 8C, a lower temperature is used, allowing the reversible crosslinks to be formed.

Figure 9:
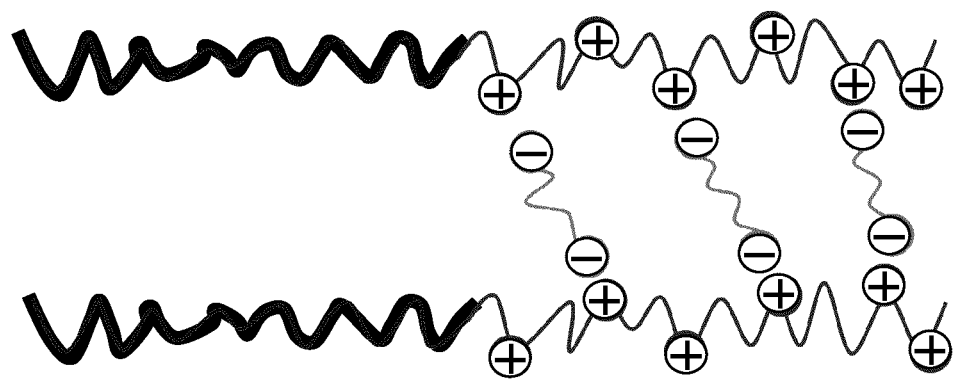
FIG. 9 schematically depicts the use of a crosslinking compound having terminal polar groups to form a composition with a block copolymer to form crosslinks between polar functional groups of second monomer of second blocks of a block copolymer.

In FIG. 9, a crosslinking compound having polar terminal groups (negatively charged in this case) is capable of electrostatic interaction to form an ionic bond with one or more polar (positively charged in this case) functional groups of the second block of the block copolymer. In this Figure, the first block is denoted by a heavy solid line and the second block by a thinner solid line. The crosslinking compound may protonate or deprotonate if a pH-sensitive terminal group is employed, and this may result in the formation of an acid-base pair between a terminal group of the crosslinking compound and a functional group of the monomer of the second block. As the crosslinking compound comprises at least two terminal groups, linked through a central moiety, and is thus capable of binding a functional group of the monomer of the second blocks, the molecules of the crosslinking compound may act as a non-covalent crosslink bridge between monomer of a second block of one molecule or between monomer of a neighboring second block of a neighboring block copolymer molecule. This enhances attractive interaction between adjacent block copolymer, and may also tighten the random coils of the second block as a result of intra-molecular crosslinking. Both intra- and inter-molecular interactions may be desirable.

Figure 10:
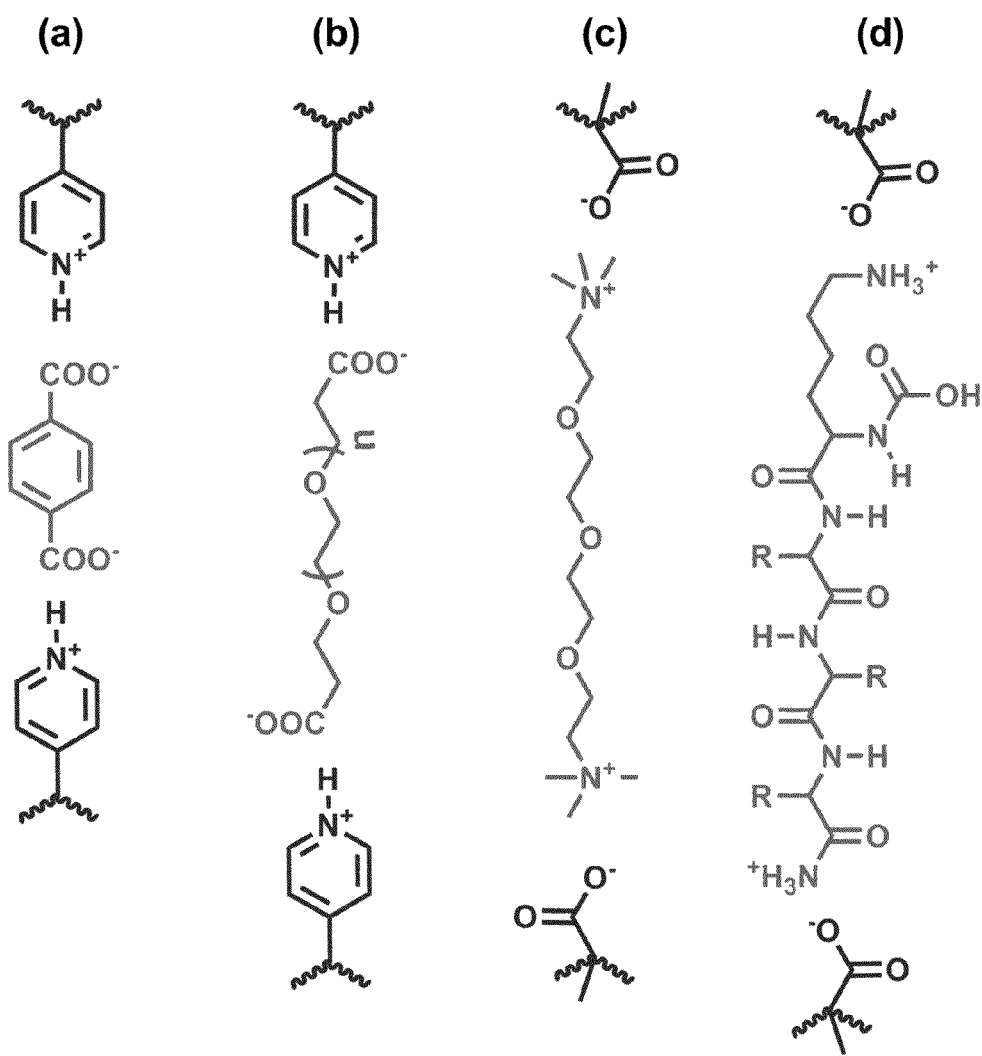
FIGS. 10(a) to 10(d) depict schematically different molecular structures for suitable functional groups of second monomer of second blocks of a block copolymer in combination with appropriate crosslinking compounds having terminal polar groups.

FIGS. 10(a) to 10(d) depict suitable arrangements of crosslinking compounds and functional groups of second monomer for use in this aspect of the invention. PVP (polyvinyl pyrrolidone) for instance, used as a second monomer in FIGS. 10(a) and 10(b), bears nitrogen atoms that can easily be protonated in presence of an acid to provide a positively charged functional group on the second blocks. A di-acid or polyacid as the crosslinking compound, having terminal acid groups, such as terminal carboxylic acid groups, may thus act as a non-covalent crosslinker with PVP as monomer of the second block, as indicated in these Figures. The length and nature of the di-acid crosslinking compound may be selected to allow close interaction between blocks (as shown in FIG. 10(a), wherein terephthalic acid is employed as the crosslinking compound). Another embodiment, wherein the second blocks, with PVP monomer, may be swelled by means of a bulkier crosslinking compound, such as an oligomeric ethylene glycol sequence terminated by carboxylic acid, is depicted schematically in FIG. 10(b), where n is an integer, say from 2 to 20.

In another suitable arrangement, an acidic functional group on the second monomer of the second blocks may be crosslinked using basic terminal groups of a crosslinking compound to provide formation of an electrostatic bridge within polymeric coils formed by the second blocks. FIG. 10(c) shows polymethacrylic acid as the second block bonding non-covalently with quaternary ammonium terminal groups linked by a central moiety of ethylene glycol of selected length.

A similar strategy may be employed by use of a polypeptidic sequence as the crosslinking compound in combination with second monomer having an acid functional group, such as methacrylate. This arrangement is depicted in FIG. 10(d). The possibility of hydrogen bonding between adjacent molecules of polypeptide crosslinking compound allows for further additional interactions that could further tighten self-assembly of the second blocks. In the embodiments depicted in FIGS. 10(a) to 10(d), the second blocks are hydrophilic in nature. The crosslinking compound to be added should therefore exhibit similar hydrophilicity in order to prevent it from demixing from the block copolymer. Hence, an oligo-amide, oligo-alcohol and/or oligo-amine may be of use as a suitable crosslinking compound. Such additives are low in molecular weight compared to the block copolymer molecules, and should not be considered as a mixed-in homopolymer exhibiting complementary interactions with the second blocks, but rather as a short organic crosslinker bridging neighboring second blocks of adjacent block copolymer molecules. The level of crosslinking compound may be varied, relative to the functional groups, from a stoichiometric ratio relative to the functional groups of the second block, to a more dilute ratio.

Figure 11:
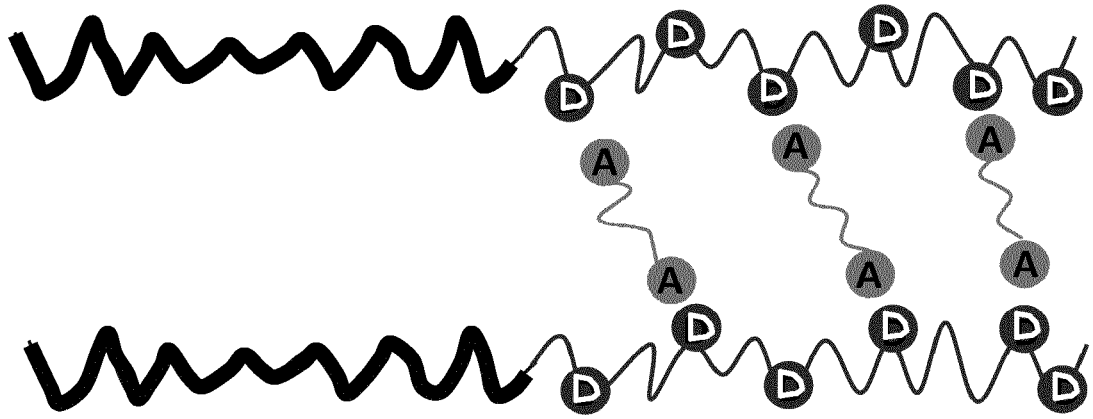
FIG. 11 schematically depicts the use of a crosslinking compound having hydrogen bonding terminal groups to form a composition with a block copolymer to form crosslinks between hydrogen bonding functional groups of second monomer of second blocks of a block copolymer.

In a further embodiment, as depicted in FIG. 11, the second blocks of the block copolymer may comprise a donor or acceptor functional group, capable of complementary bonding with an acceptor or donor terminal group of the crosslinking compound, respectively, by means of reversible hydrogen bonding. In this Figure, the first blocks are shown as heavy solid lines and the second blocks as thinner solid lines with donor functional groups of the block copolymer molecules denoted by D and terminal acceptor groups of the molecules of crosslinking compound denoted by A.

Figure 12:
FIGS. 12(a) to 12(d) depict schematically different molecular structures for suitable hydrogen bonding functional groups of second monomer of second blocks of a block copolymer in combination with appropriate crosslinking compounds having hydrogen bonding terminal groups.
Figure 12:
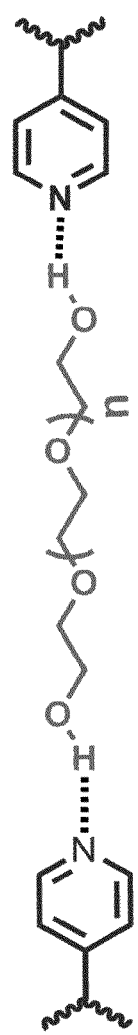
Figure 12:
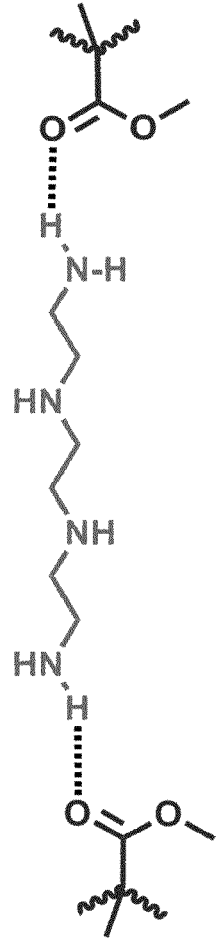
Figure 12:
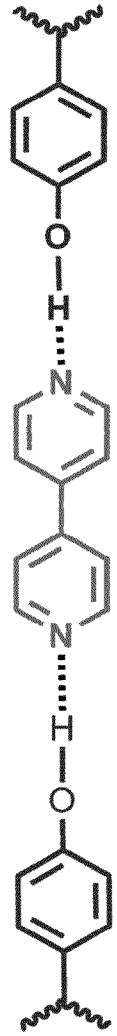

Examples of suitable pairs of functional group and crosslinking compound for hydrogen bonding are set out schematically in FIGS. 12(a) to 12(d). PVP for instance, used as functional group of the second block in FIGS. 12(a) and 12(b), bears nitrogen atoms that can easily interact with an alcohol or ester. A di-alcohol or polyalcohol will bind to multiple functional groups of second block at the same time, and therefore act as a non-covalent hydrogen-bonding crosslinker. The length and nature of polyalcohol, such as di-alcohol, can be adjusted to allow close interaction between blocks. In FIG. 12(a), the use of hydroquinone as crosslinking compound with terminal alcohol groups is shown in combination with second monomer that is of PVP. In order to swell the second blocks, when PVP monomer is present to provide pyridine functional groups, a bulkier crosslinking compound, such as an oligomeric ethylene glycol sequence terminated by alcohol terminal groups, may be used. This is depicted in FIG. 12(b), where n represents an integer typically less than 10.

Second blocks based on PMMA as second monomer are depicted in FIG. 12(c). This functional group may bond via reversible hydrogen bonding with amine terminal groups of a crosslinking compound, as shown in this Figure.

Conversely, as shown in FIG. 12(d), the second blocks may include an alcohol or amine functional group to act as a donor for hydrogen bonding. FIG. 12(d) depicts, for instance, a polyhydroxystyrene second block crosslinked by hydrogen bonding of the OH functional group of the second block with terminal pyridine groups of bipyridine. Suitably, the hydrophobic/hydrophilic character (i.e. chemical affinity) of the crosslinking compound should be such that demixing is substantially prevented. The crosslinking compound has a lower molecular weight than the block copolymer and should not be considered as a mixed-in homopolymer with complementary interactions with one of the blocks, but rather as a short organic compound providing reversible crosslinking bridges between neighboring second blocks of block copolymer. The level of crosslinking compound may be varied, relative to the functional group, from a stoichiometric ratio to a more dilute ratio.

To address one or more problems of defect formation, and to address a desire for further reduction in feature dimensions in lithography, increasing the Flory-Huggins parameter for a block copolymer may be achieved by incorporating a crosslinking compound, as set out hereinbefore, into a composition with the block copolymer. By selection of the chemical nature of the crosslinking compound, the hydrophobicity or hydrophilicity of the crosslinked block can be enhanced. As a result, phase separation leading to self-assembly may be enhanced as compared to the original block copolymer without the crosslinking compound present. For instance, a crosslinking compound rich in oxygen atoms, interacting specifically with the most hydrophilic blocks of a block copolymer, may render these blocks even more hydrophilic.

The tightening of interactions between similar (second) blocks, made available by use of this aspect of the invention, may provide an effective increase in Flory-Huggins parameter for the composition, as compared to the Flory-Huggins parameter for the block copolymer itself, leading to the resulting self-assembly having greater thermodynamic stability. The crosslinking compound is desirably adapted to segregate into one domain (of the second blocks) due to its similar chemical affinity to the second blocks, and may be introduced in solution, with the block copolymer, prior to formation or deposition of the block copolymer layer onto a substrate. Alternatively or additionally, the crosslinking compound may be introduced after deposition of the block copolymer, for instance during annealing. The crosslinking is suitably reversible with temperature change or in the presence of solvent, or by use of pH change, for instance. Phase separation of the block copolymer and its self-assembly is still driven by the immiscibility between the blocks of the polymer, but may be reinforced further by non-covalent crosslinks forming and/or breaking while annealing as a result of the presence and behavior of the crosslinking compound.

The introduction of additional interactions with a type of block of a block copolymer molecule may allow for tighter interactions within random coils in domains and this may be effective in achieving a locally-increased Flory-Huggins parameter for the block copolymer. The chemical nature of the crosslinking compound may be used to modify the hydrophobicity/hydrophilicity of a particular domain (the domain of second blocks in this specification), so enhancing the potential for phase separation. The desired increase in local Flory-Huggins parameter may be achieved by this aspect without undesired increase in molecular weight of the block copolymer. This may provide sharper phase separation, with improved placement of self-assembled block copolymer in a thin film layer, and may result in improved critical dimension uniformity, leading to an overall decrease in defect level. Thus, the presence of the crosslinking compound may give rise to improved self-assembly behavior through local increase in the Flory-Huggins parameter for the block copolymer.

The described and illustrated embodiments are to be considered as illustrative and not restrictive in character, it being understood that only preferred embodiments have been shown and/or described and that all changes and modifications that come within the scope of the inventions as defined in the claims are desired to be protected. For instance, rather than the blocks being of polystyrene and polymethylmethacrylate, other mutually chemically immiscible blocks may be used in the self-assemblable block copolymer to drive the self-assembly process.

An embodiment of the invention allows for formation onto a substrate of a chemical pre-pattern template or a graphoepitaxy template without any particular limitation on the combination of substrate and self assemblable polymer to be aligned using the template.

An embodiment of the present invention relates to a lithography method. The method may be used in a process for the manufacture of a device, such as an electronic device, an integrated circuit, an integrated optical system, a guidance and detection pattern for a magnetic domain memory, a flat-panel display, a liquid-crystal display (LCD), a thin film magnetic head, an organic light emitting diode, etc. An embodiment of the invention is of use to create a regular nanostructure on a surface for use in the fabrication of an integrated circuit, a bit-patterned media and/or a discrete track medium for a magnetic storage device (e.g. for a hard drive).

An embodiment of the invention is of use for high resolution lithography, where features patterned onto a substrate have a feature width or critical dimension of about 1 μm or less, typically 100 nm or less or even 10 nm or less.

Lithography may involve applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in an electrical connection between layers not being made. This, in turn, may cause a device to be non-functional. Lithographic apparatus therefore usually includes an alignment apparatus, which may be used to align each pattern with a previously provided pattern, and/or with an alignment mark provided on the substrate.

In this specification, the term "substrate" is meant to include any surface layer forming part of the substrate, or being provided on a substrate, such as one or more planarization layers or anti-reflection coating layers which may be at, or form, the surface of the substrate.

The invention claimed is:

1. A block copolymer comprising a first block of first monomer and a second block of second monomer, the copolymer adapted to undergo a transition from a disordered state to an ordered state at a temperature less than $T_{OD}$, the copolymer further comprising a bridging moiety comprising a functional group arranged to provide hydrogen bonding between bridging moieties of adjacent first and second block copolymer molecules when in the ordered state and at a temperature in excess of a glass transition temperature $T_g$ for the copolymer.

2. The block copolymer of claim 1, wherein the bridging moieties of adjacent first and second block copolymer molecules are arranged to be mutually bondable by hydrogen bonding at a temperature at or below a transition temperature $T_H$, wherein $T_{OD}$ is greater than $T_H$ and $T_H$ is greater than $T_g$, and wherein the first and second adjacent molecules of the block copolymer are not mutually bondable by hydrogen bonding at a temperature in excess of $T_H$.

3. The block copolymer of claim 1, wherein the first and second blocks are each directly covalently bonded to the bridging moiety.

4. The block copolymer of claim 1, wherein the hydrogen bonding is between first functional groups of the bridging moiety of the first adjacent molecules and second functional groups of the bridging moiety of the second adjacent molecules and between second functional groups of the bridging moiety of the first adjacent molecules and first functional groups of the bridging moiety of the second adjacent molecules.

5. The block copolymer of claim 1, wherein the bridging moiety comprises at least one urea group.

6. The block copolymer of claim 1, wherein the bridging moiety comprises at least one 2-ureido[1H]-pyrimidin-4-one group.

7. The block copolymer of claim 1, wherein the bridging moiety comprises at least one peptide group.

8. The block copolymer of claim 7, wherein the peptide group comprises from 2 to 10 amino acids.

9. The block copolymer of claim 8, wherein the peptide group is a polyalanine.

10. The block copolymer of claim 1, wherein the bridging moiety further comprises an oligomeric stabilizing portion having a low chemical affinity with both the first monomer and with the second monomer.

11. The block copolymer of claim 10, wherein the oligomeric stabilizing portion is selected from the group consisting of: an oligomer comprising an aromatic ring, a perfluorinated oligomer, and a silicone oligomer.

12. A method for providing an ordered layer of a block copolymer on a substrate, the block copolymer having a glass transition temperature $T_g$ and comprising a first block of first monomer, a second block of second monomer and a bridging moiety comprising a functional group,
    wherein the block copolymer is adapted to undergo a transition from a disordered state to an ordered state at a temperature less than $T_{OD}$,
    wherein bridging moieties of adjacent first and second block copolymer molecules when in the ordered state are arranged to be mutually bondable by hydrogen bonding due to the functional group at a temperature that is less than or equal to a transition temperature $T_H$ and is in excess of $T_g$, wherein $T_{OD}$ is greater than $T_H$,
    the method comprising:
    providing a layer of the block copolymer on the substrate,
    maintaining the layer at a first temperature $T_1$ above $T_g$, wherein the first temperature $T_1$ is less than or equal to $T_{OD}$ and greater than $T_H$, so that the block copolymer assembles to provide an ordered layer,
    cooling the ordered layer to a second temperature $T_2$ wherein $T_2$ is less than or equal to $T_H$ and greater than $T_g$ and maintaining the ordered layer at temperature $T_2$ so that hydrogen bonding between the bridging moiety of adjacent molecules is effected, and
    cooling the block copolymer to a temperature below its glass transition temperature $T_g$.

13. The method of claim 12 wherein after the cooling of the ordered layer to a second temperature $T_2$, the layer is cycled in temperature between alternating first and second temperatures prior to the cooling of the block copolymer to a temperature below its glass transition temperature $T_g$.

14. A method for providing an ordered layer of a block copolymer on a substrate, the block copolymer having a glass transition temperature $T_g$ and comprising a first block of first monomer, a second block of second monomer and a bridging moiety comprising a functional group,
    wherein the block copolymer is adapted to undergo a transition from a disordered state to an ordered state at a temperature less than $T_{OD}$,
    wherein bridging moieties of adjacent first and second block copolymer molecules when in the ordered state are arranged to be mutually bondable by hydrogen bonding due to the functional group at a temperature that is less than or equal to a transition temperature $T_H$ and is in excess of $T_g$, wherein $T_H$ is greater than $T_{OD}$,
    the method comprising:
        providing a layer of the block copolymer on the substrate,
        maintaining the layer at a first temperature $T_1$ above $T_g$, wherein the first temperature $T_1$ is greater than $T_{OD}$ and less than or equal to $T_H$, so that hydrogen bonding between the bridging moiety of adjacent molecules is effected and the block copolymer pre-assembles through hydrogen bonding of the bridging moiety,
        cooling the ordered layer to a second temperature $T_2$ wherein $T_2$ is less than $T_{OD}$ or $T_H$ and greater than $T_g$ and maintaining the ordered layer at temperature $T_2$ so that the block-copolymer self-assembles, and
        cooling the block copolymer to a temperature below its glass transition temperature $T_g$.

15. A lithography method for patterning a surface of a substrate by resist etching, wherein the method comprises providing an ordered layer of block copolymer at the surface by the method of claim 12, at least partially removing the first block or second block from the ordered block copolymer layer, and etching on the surface of the substrate using the other of the first block or second block as a resist layer during the etching.

16. A composition comprising:
    a block copolymer comprising a first block of first monomer and a second block of second monomer, the copolymer adapted to undergo a transition from a disordered state to an ordered state at a temperature less than $T_{OD}$, and
    a crosslinking compound having first and second terminal groups joined by a central moiety and arranged to crosslink second blocks of adjacent first and second block copolymer molecules by providing non-covalent bonding between the terminal groups and a functional group of the second monomer of the second blocks when the block copolymer is in the ordered state and at a temperature in excess of a glass transition temperature $T_g$ for the block copolymer.

17. The composition of claim 16, wherein the non-covalent bonding is hydrogen bonding between the terminal groups and the functional group of the second monomer.

18. The composition of claim 16, wherein the non-covalent bonding is ionic bonding between charged terminal groups and an oppositely charged functional group of the second monomer.

19. The composition of claim 16, wherein the crosslinking occurs at a temperature at or below a transition temperature $T_H$, wherein $T_{OD}$ is greater than $T_H$ and $T_H$ is greater than $T_g$, and wherein the crosslinking is not substantially present at a temperature in excess of $T_H$.

20. The composition of claim 16, wherein the crosslinking compound has a molecular weight of 1500 Dalton or less.

21. A lithography method for patterning a surface of a substrate by resist etching, wherein the method comprises providing an ordered layer of block copolymer at the surface from a composition according to claim 16, at least partially removing the first block or second block from the ordered block copolymer layer, and etching on the surface of the substrate using the other of the first block or second block as a resist layer during the etching.

* * * * *